United States Patent
Clark, Jr. et al.

(10) Patent No.: US 7,936,017 B2
(45) Date of Patent: May 3, 2011

(54) REDUCED FLOATING BODY EFFECT WITHOUT IMPACT ON PERFORMANCE-ENHANCING STRESS

(75) Inventors: William F. Clark, Jr., Essex Junction, VT (US); Toshiharu Furukawa, Essex Junction, VT (US); Xuefeng Hua, Guilderland, NY (US); Charles W. Koburger, III, Delmar, NY (US); Robert R. Robison, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 352 days.

(21) Appl. No.: 12/120,836

(22) Filed: May 15, 2008

(65) Prior Publication Data

US 2009/0283828 A1    Nov. 19, 2009

(51) Int. Cl.
  *H01L 27/01* (2006.01)
  *H01L 27/12* (2006.01)
  *H01L 31/0392* (2006.01)
(52) U.S. Cl. .................. 257/347; 257/192; 438/530
(58) Field of Classification Search .................. 257/192, 257/347, 373, E21.334; 438/530
See application file for complete search history.

(56) References Cited

U.S. PATENT DOCUMENTS

| | | | |
|---|---|---|---|
| 5,963,809 A * | 10/1999 | Duane et al. | 438/286 |
| 6,210,998 B1 * | 4/2001 | Son | 438/162 |
| 6,437,375 B1 | 8/2002 | Beaman | |
| 6,479,866 B1 * | 11/2002 | Xiang | 257/347 |
| 6,509,613 B1 | 1/2003 | En et al. | |
| 6,770,517 B2 | 8/2004 | Nakaoka et al. | |
| 7,129,141 B2 | 10/2006 | Oyu et al. | |
| 7,288,819 B2 | 10/2007 | Bhattacharyya | |
| 7,312,137 B2 | 12/2007 | Li | |
| 7,446,026 B2 * | 11/2008 | Zhang et al. | 438/592 |
| 7,554,110 B2 * | 6/2009 | Yu et al. | 257/18 |
| 2006/0223292 A1 | 10/2006 | Okonogi et al. | |
| 2007/0252205 A1 | 11/2007 | Hoentschel et al. | |
| 2007/0254444 A1 | 11/2007 | Bloomquist et al. | |

* cited by examiner

*Primary Examiner* — Phuc T Dang
(74) *Attorney, Agent, or Firm* — Anthony Canale; Hoffman Warnick LLC

(57) ABSTRACT

A method, gated device and design structure are presented for providing reduced floating body effect (FBE) while not impacting performance enhancing stress. One method includes forming damage in a portion of a substrate adjacent to a gate; removing a portion of the damaged portion to form a trench, leaving another portion of the damaged portion at least adjacent to a channel region; and substantially filling the trench with a material to form a source/drain region.

11 Claims, 8 Drawing Sheets

REDUCED FLOATING BODY EFFECT WITHOUT IMPACT ON PERFORMANCE-ENHANCING STRESS

BACKGROUND

1. Technical Field

The disclosure relates generally to integrated circuit (IC) chip fabrication, and more particularly, to reducing floating body effect in a gated device without impacting performance enhancing stress.

2. Background Art

Stress induced device performance enhancement by embedded silicon germanium (e-SiGe) and embedded carbon doped silicon (e-SiC) are used in new silicon-on-insulator (SOI) IC technology nodes, e.g., 45 nm and 32 nm. In these technologies, source/drain (S/D) diodes are made leaky such that a reverse bias at the drain tends to pull the body voltage toward the drain voltage, the body while the leaky forward bias at the source tends to pull the body toward the source voltage, thus achieving body equilibrium. The above-described technique reduces the floating body effect (FBE). Currently, one method by which S/D diodes are made leaky is by implanting species such as xenon (Xe) during S/D implantation and creating crystalline defects in the depletion region by S/D activation anneal. This implant and anneal process tends to relax the stress created to enhance the device performance achieved by the use of strained materials.

SUMMARY

A method, gated device and design structure are presented for providing reduced floating body effect (FBE) while not impacting performance enhancing stress. One method includes forming damage in a portion of a substrate adjacent to a gate; removing a portion of the damaged portion to form a trench, leaving another portion of the damaged portion at least adjacent to a channel region; and substantially filling the trench with a material to form a source/drain region.

A first aspect of the disclosure provides a method comprising: forming damage in a portion of a substrate adjacent to a gate; removing a portion of the damaged portion to form a trench, leaving another portion of the damaged portion at least adjacent to a channel region; and substantially filling the trench with a material to form a source/drain region.

A second aspect of the disclosure provides a gated device comprising: a gate over a substrate; and a source/drain region and a channel region in the substrate, the source/drain region including a stress inducing material; wherein the substrate includes a damaged portion in or near the channel region to create a leakage current, and wherein the damaged portion does not extend into the stress inducing source/drain region.

A third aspect of the disclosure provides a design structure embodied in a machine readable medium for designing, manufacturing, or testing an integrated circuit, the design structure comprising: a gated device comprising: a gate over a substrate; and a source/drain region and a channel region in the substrate, the source/drain region including a stress inducing material; wherein the substrate includes a damaged portion in or near the channel region to create a leakage current, and wherein the damaged portion does not extend into the stress inducing source/drain region.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Figure 1:
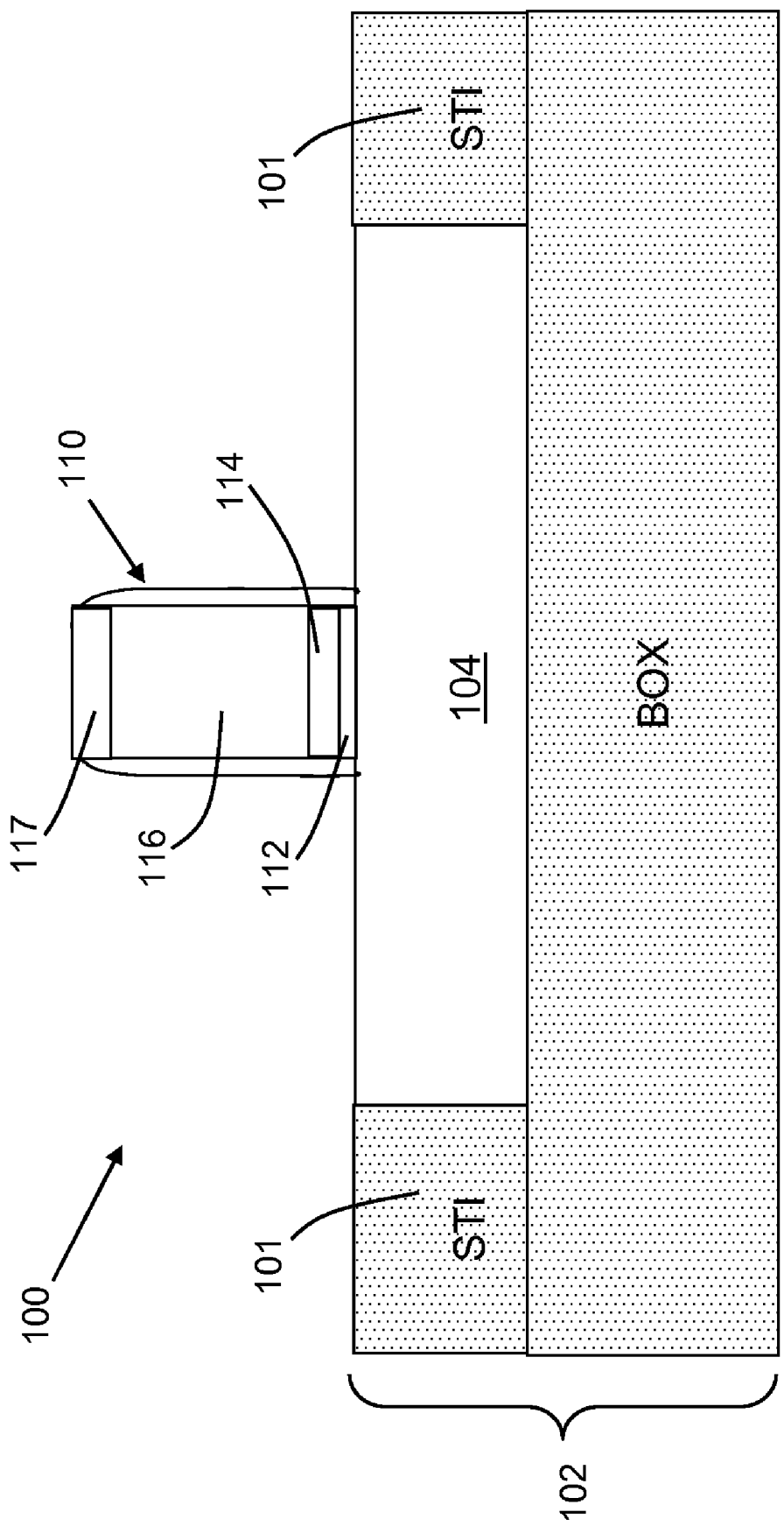
FIGS. 1-7 show embodiments of a method according to the disclosure, with FIGS. 6 and 7 showing embodiments of a gated device according to the disclosure.
Figure 4:
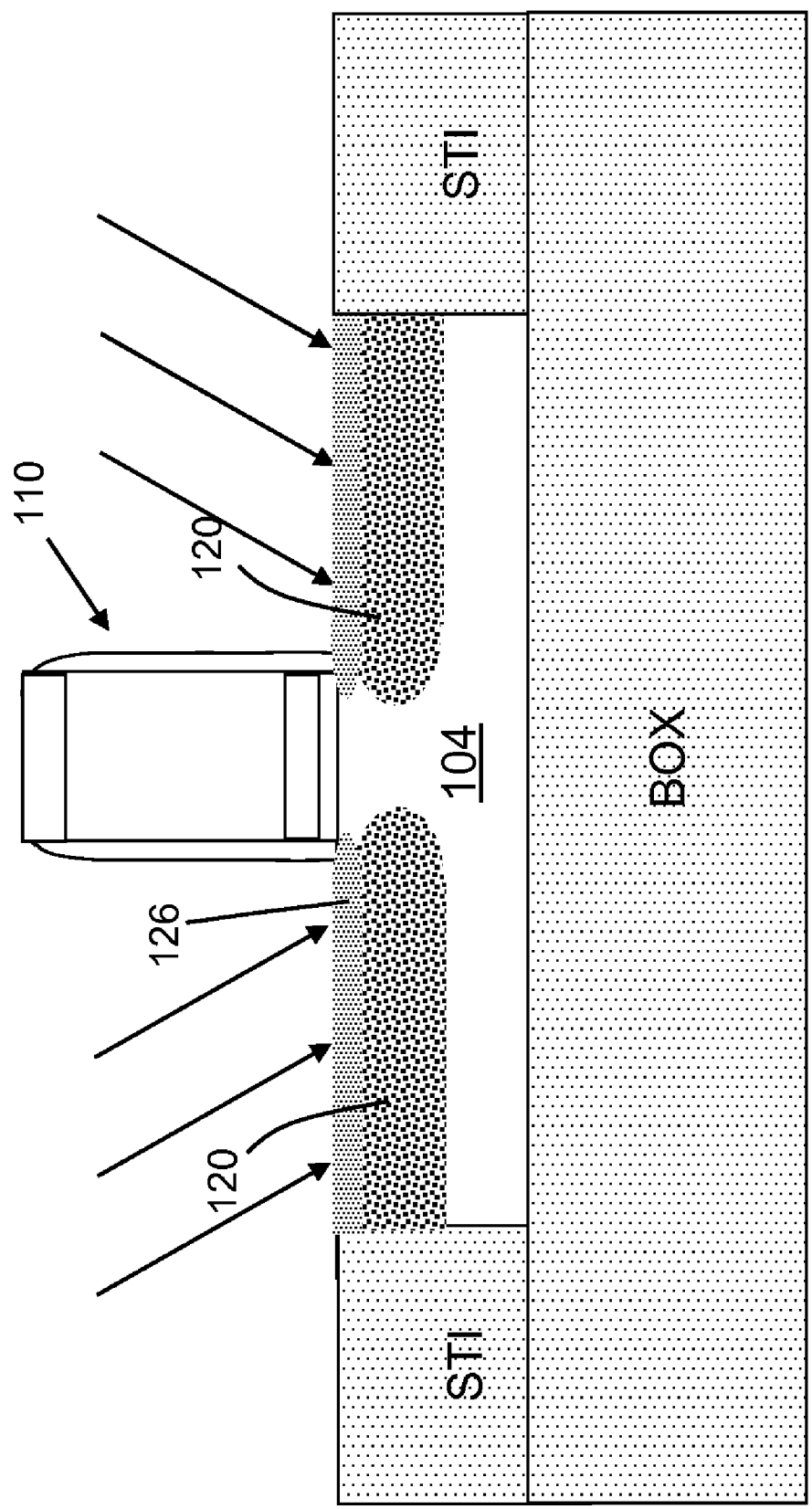
Figure 5:
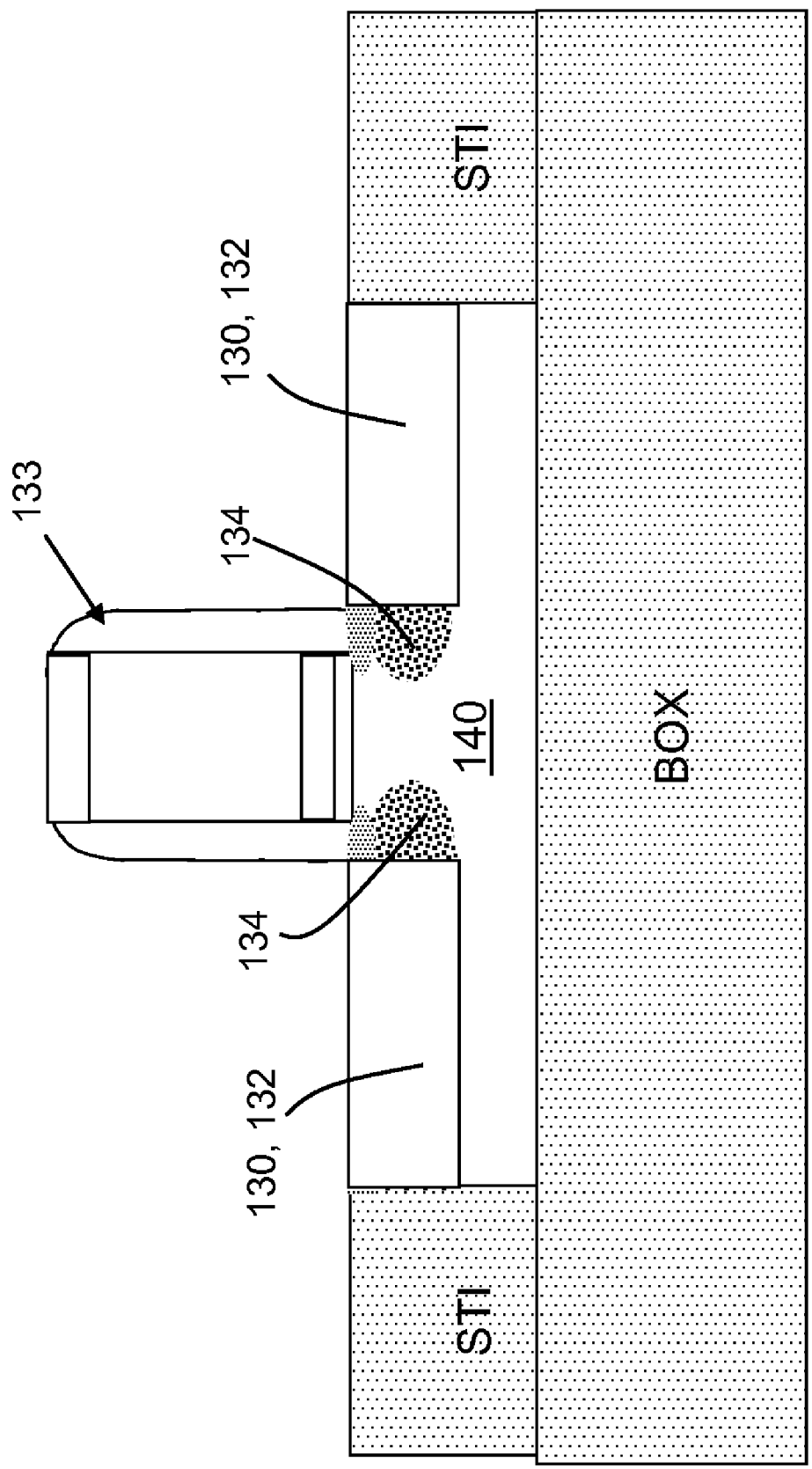
Figure 6:
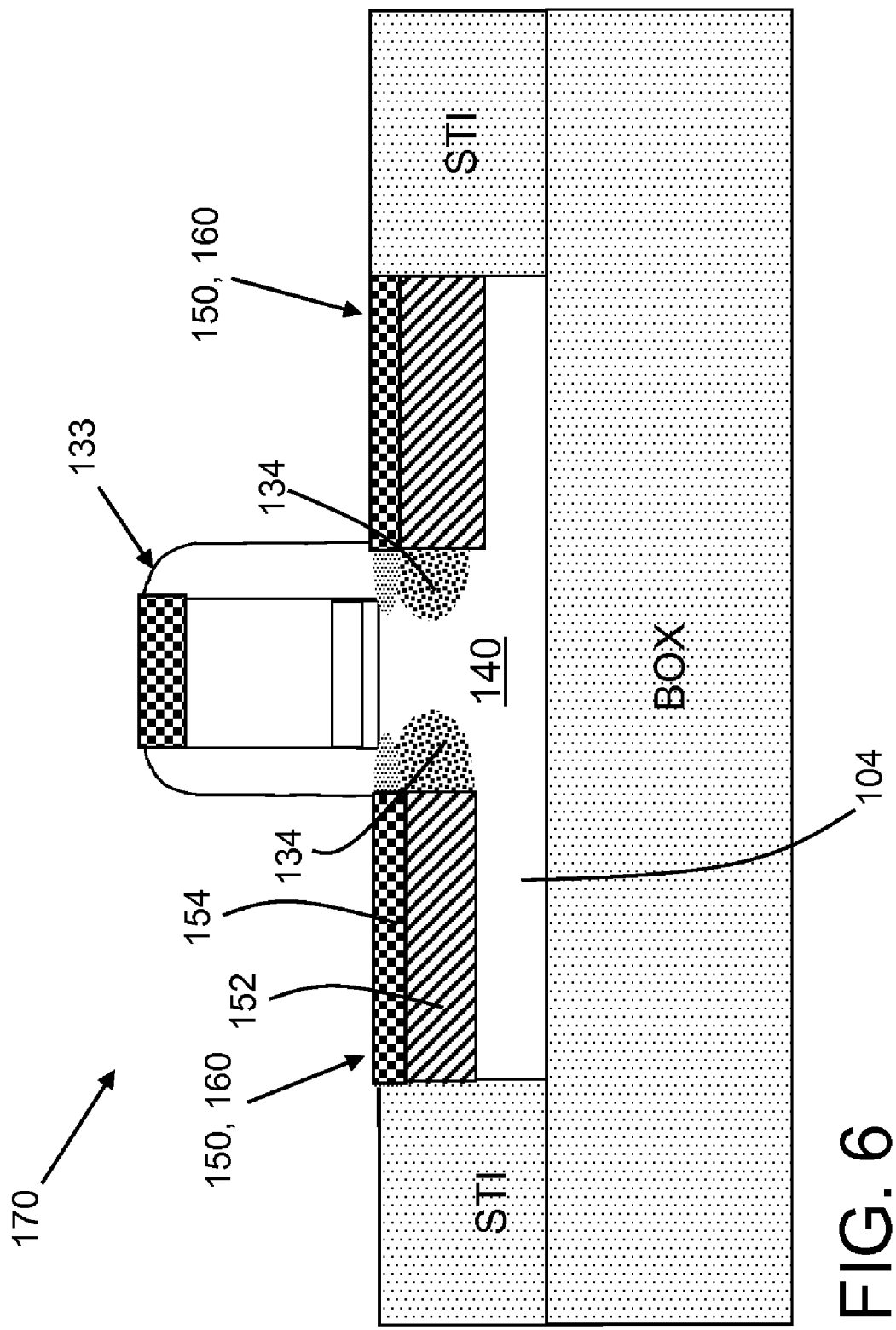
Figure 7:
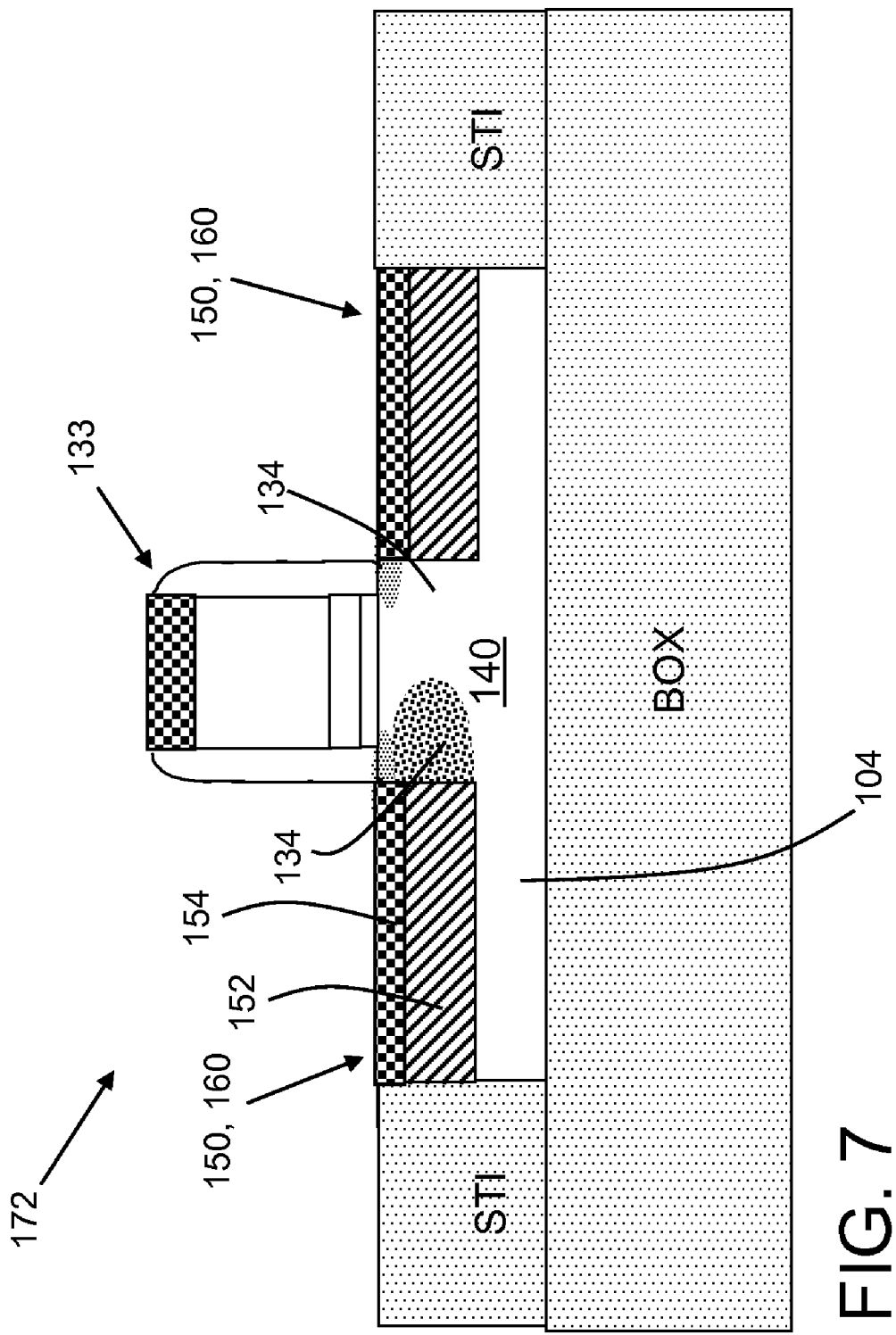

FIGS. 1-7 show embodiments of a method according to the disclosure, with FIGS. 6 and 7 showing embodiments of a gated device 170, 172, respectively, according to the disclosure. FIG. 1 shows an initial structure 100 after trench isolation 101 formation in a semiconductor-on-insulator (SOI) substrate 102 (layer below buried insulator (BOX) layer omitted for clarity). Trench isolations 101 may be in the form of shallow trench isolations (STI) and may include silicon dioxide ($SiO_2$). SOI layer 104 of SOI substrate 102 may include silicon, germanium, silicon germanium, silicon carbide, and those materials consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable materials for SOI layer 104 of substrate 102 include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion of, or the entire SOI layer 104 may be strained.

Structure 100 also includes well implants (not shown) and a gate 110. Gate 110 may include any now known or later developed structure such as a high dielectric constant (high-k) gate dielectric 112, a gate conductor 114 (e.g., metal 114 and in-situ doped polysilicon 116), gate capping layer 117 and spacer(s).

Figure 2:
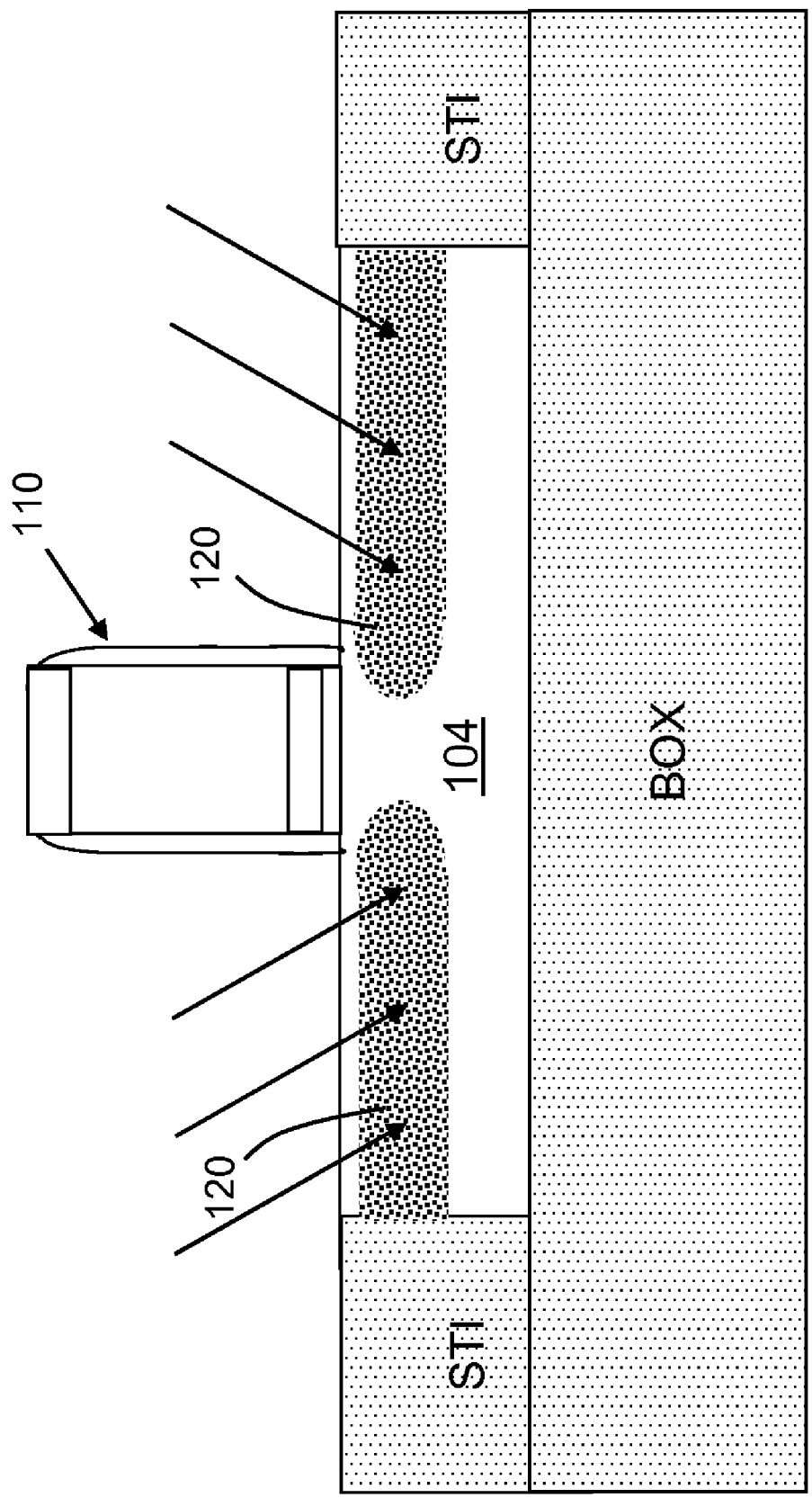
Figure 3:
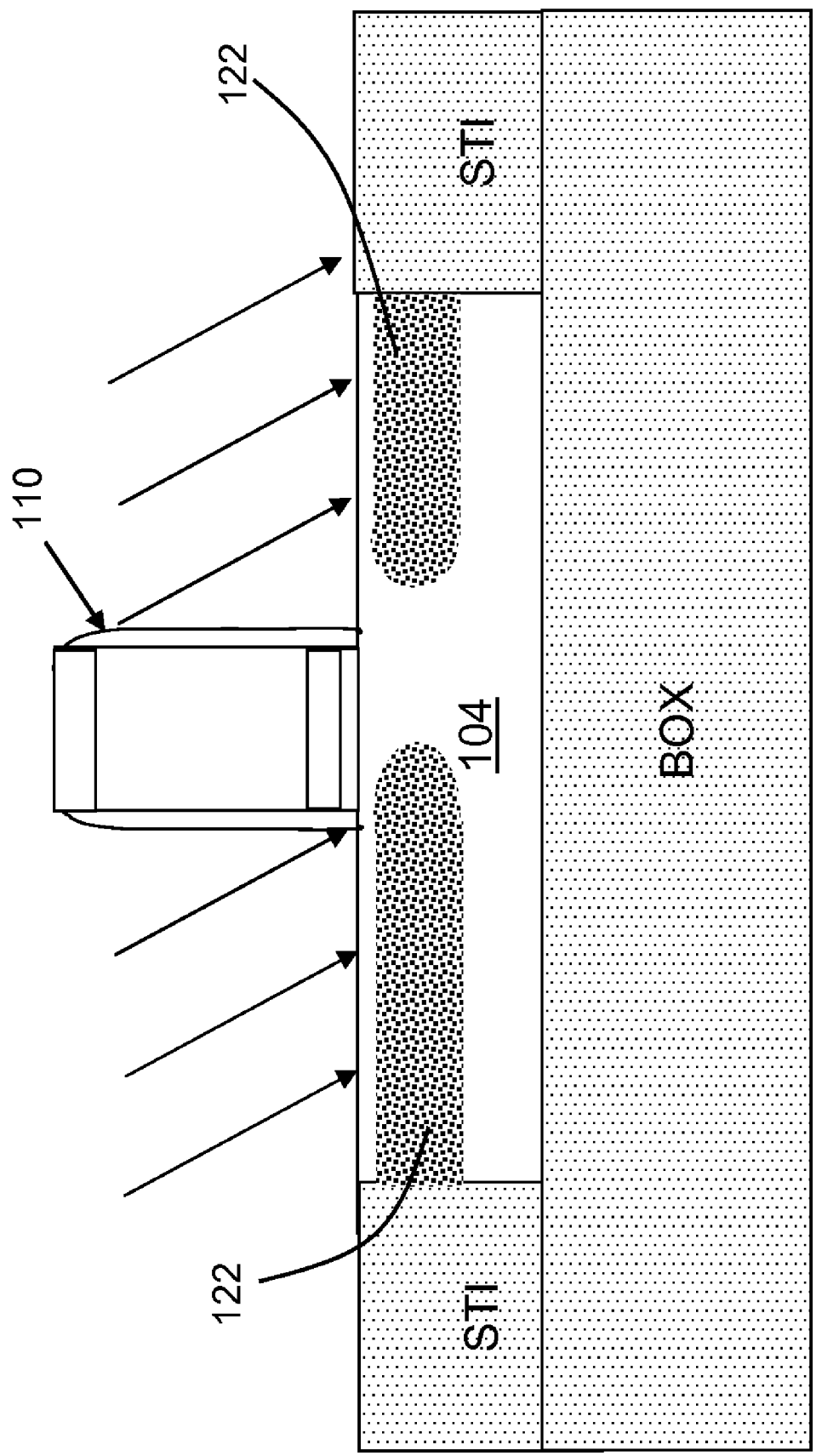

FIG. 2 shows formation of damage 120 in a portion of substrate 102 (i.e., SOI layer 104) adjacent to gate 110. In one embodiment, this process includes implanting a species and annealing. The species may include xenon (Xe), silicon (Si), germanium (Ge), nitrogen (N), oxygen (O), carbon (C) or a combination thereof. The implant, as shown in FIG. 2, may include a dual directional damage inducing implant as well as Halo implant, forming symmetrical damaged portions 120 and halo doping area (not shown) about gate 110. The dopant type of halo implant is same as SOI layer (body) 104 dopant and the halo doping improves the short channel effect of the device. In an alternative embodiment, as shown in FIG. 3, the implants may include single-directional implants, forming asymmetrical damaged portions 122 and halo doping area (not shown) about gate 110. In either embodiment, annealing will re-crystallize the SOI layer 104 above damaged portions 120, 122.

FIG. 4 shows a dual-directional source/drain extension 126 implant for the symmetrical embodiment of FIG. 2. The doping type of the source/drain extension 126 is the opposite type of body and halo dopant. For NFET, the dopant is n-type dopant such as As and P, while for PFET the dopant is p-type dopant such B.

FIG. 5 shows removing a portion 130 of damaged portion 120 (and source/drain extension 126) to form a trench 132, e.g., by directional reactive ion etching (RIE) with a new spacer 133, leaving another portion 134 of damaged portion 120 (halo area and extension area 126) at least adjacent to channel region 140 (in SOI layer 104 (FIG. 4). FIG. 5 is shown relative to the symmetrical embodiment of FIG. 2; however, those with skill in the art will recognize that it is equally applicable to the asymmetrical embodiment of FIG. 3.

FIG. 6 shows substantially filling trench 132 with a material 150 to form a source/drain region 160. In one embodiment, the filling process may include performing an in-situ doped epitaxial growth from SOI layer 104, resulting in the same material 152 as SOI layer 104 for source/drain region 160 of gate 110. For NFET, the dopants are n-type dopant such as As and P and tensile stress inducing dopant of C, while for PFET the dopants are p-type dopant such as B and compressive stress inducing dopant of Ge. Hence, material 152 may generally include germanium doped silicon, carbon doped silicon or silicon depending on the type of device to be built. This filling process may also include forming a silicide 154, e.g. nickel silicide, over material 152. The silicide may be formed using any now known or later developed technique, e.g., depositing a metal, annealing, and removing any residual metal. Conventional interlayer contact formation (not shown) may then follow, e.g., deposition of an interlayer dielectric, contact patterning and forming. FIG. 7 shows the same processing as in FIG. 6 after application to the asymmetrical embodiment of FIG. 3. In this embodiment, only one damaged portion 134 and the halo (not shown) remain. In any event, since the damaged portion that generates a leakage current to reduce FBE is formed prior to source/drain region formation, the impact of this formation on performance enhancing stress material 152 is eliminated.

FIGS. 6 and 7 show a gated device 170, 172, respectively, resulting from the above-described methods. Devices 170, 172 each include gate 110 over substrate 102, source/drain region 160 and channel region 140 in substrate 102. Source/drain region 160 includes a stress inducing material. Damaged portion 134 in or near channel region 140 induces a leakage current, but does not extend into stress inducing source/drain region 160. FIG. 6 shows symmetrical source/drain regions 160 about gate 110 and FIG. 7 shows asymmetrical source/drain regions 160 about gate 110. As noted above, damaged portion 134 may be created by implantation of a species such as xenon y(Xe), silicon (Si), germanium (Ge), nitrogen (N), oxygen (O), carbon (C) or a combination thereof.

Figure 8:
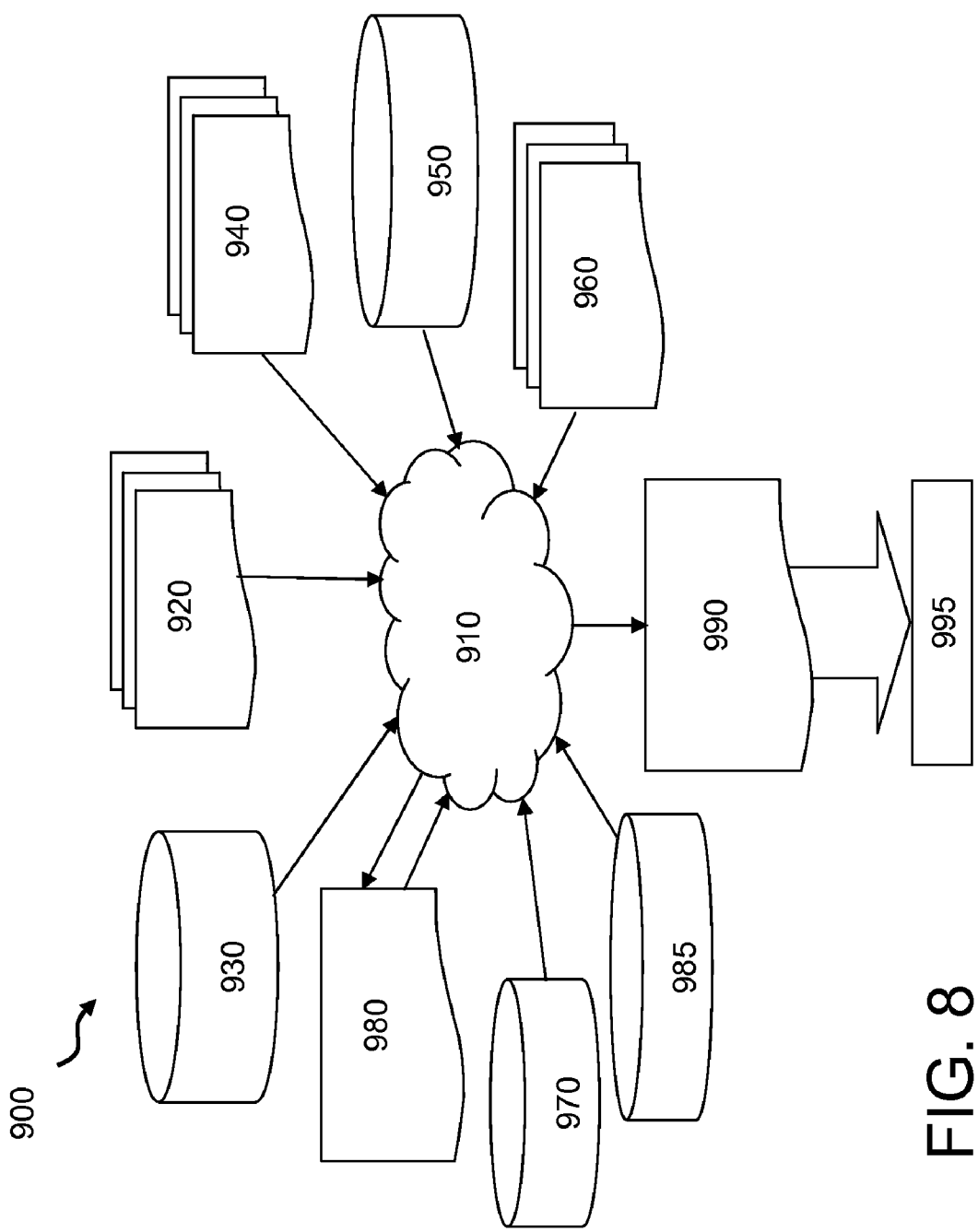
FIG. 8 shows a flow diagram of a design process used in semiconductor design, manufacture, and/or test.

FIG. 8 shows a block diagram of an exemplary design flow 900 used for example, in semiconductor design, manufacturing, and/or test. Design flow 900 may vary depending on the type of IC being designed. For example, a design flow 900 for building an application specific IC (ASIC) may differ from a design flow 900 for designing a standard component. Design structure 920 is preferably an input to a design process 910 and may come from an IP provider, a core developer, or other design company or may be generated by the operator of the design flow, or from other sources. Design structure 920 comprises an embodiment of the invention as shown in FIGS. 6 or 7 in the form of schematics or HDL, a hardware-description language (e.g., Verilog, VHDL, C, etc.). Design structure 920 may be contained on one or more machine readable medium. For example, design structure 920 may be a text file or a graphical representation of an embodiment of the invention as shown in FIGS. 6 or 7. Design process 910 preferably synthesizes (or translates) an embodiment of the invention as shown in FIGS. 6 or 7 into a netlist 980, where netlist 980 is, for example, a list of wires, transistors, logic gates, control circuits, I/O, models, etc. that describes the connections to other elements and circuits in an integrated circuit design and recorded on at least one of machine readable medium. For example, the medium may be a CD, a compact flash, other flash memory, a packet of data to be sent via the Internet, or other networking suitable means. The synthesis may be an iterative process in which netlist 980 is resynthesized one or more times depending on design specifications and parameters for the circuit.

Design process 910 may include using a variety of inputs; for example, inputs from library elements 930 which may house a set of commonly used elements, circuits, and devices, including models, layouts, and symbolic representations, for a given manufacturing technology (e.g., different technology nodes, 32 nm, 45 nm, 90 nm, etc.), design specifications 940, characterization data 950, verification data 960, design rules 970, and test data files 985 (which may include test patterns and other testing information). Design process 910 may further include, for example, standard circuit design processes such as timing analysis, verification, design rule checking, place and route operations, etc. One of ordinary skill in the art of integrated circuit design can appreciate the extent of possible electronic design automation tools and applications used in design process 910 without deviating from the scope and spirit of the invention. The design structure of the invention is not limited to any specific design flow.

Design process 910 preferably translates an embodiment of the invention as shown in FIGS. 6 or 7, along with any additional integrated circuit design or data (if applicable), into a second design structure 990. Design structure 990 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 990 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 6 or 7. Design structure 990 may then proceed to a stage 995 where, for example, design structure 990: proceeds to tape-out, is released to manufacturing, is released to a mask house, is sent to another design house, is sent back to the customer, etc.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A gated device comprising:
   a gate over a substrate; and
   a source/drain region and a channel region in the substrate, the source/drain region including a stress inducing material; wherein the substrate includes a damaged portion in or near the channel region to create a leakage current, and wherein the damaged portion is adjacent to the stress inducing source/drain region and does not extend into the stress inducing source/drain region.

2. The gated device of claim 1, wherein the source/drain region is symmetrical about the gate.

3. The gated device of claim 1, wherein the source/drain region is asymmetrical about the gate.

4. The gated device of claim 1, wherein the stressed material is selected from the group consisting of: germanium doped silicon and carbon doped silicon.

5. The gated device of claim 4, wherein the material is epitaxially grown material.

6. The gated device of claim 1, wherein the damage portion is formed by implanting of an species selected from the group consisting of: xenon (Xe), silicon (Si), germanium (Ge), nitrogen (N), oxygen (O), carbon (C) or a combination thereof.

7. A design structure embodied in a machine readable medium for designing, manufacturing, or testing an integrated circuit, the design structure comprising:
   a gated device comprising:
      a gate over a substrate; and
      a source/drain region and a channel region in the substrate, the source/drain region including a stress inducing material; wherein the substrate includes a damaged portion in or near the channel region to create a leakage current, and wherein the damaged portion is adjacent to the stress inducing source/drain region and does not extend into the stress inducing source/drain region.

8. The design structure of claim 7, wherein the design structure comprises a netlist.

9. The design structure of claim 7, wherein the design structure resides on storage medium as a data format used for the exchange of layout data of integrated circuits.

10. The design structure of claim 7, wherein the design structure includes at least one of test data, characterization data, verification data, or design specifications.

11. The design structure of claim 7, wherein the source/drain region is symmetrical about the gate.

* * * * *